United States Patent [19]
Dorri et al.

[11] Patent Number: 5,140,266
[45] Date of Patent: Aug. 18, 1992

[54] APPARATUS AND METHOD FOR THE NON-DESTRUCTIVE EVALUATION OF A BIFILAR SUPERCONDUCTING WINDING

[75] Inventors: Bizhan Dorri, Clifton Park, N.Y.; Bu-Xin Xu, Florence, S.C.

[73] Assignee: General Electric Company, Schenectady, N.Y.

[21] Appl. No.: 710,595

[22] Filed: Jun. 5, 1991

[51] Int. Cl.⁵ .................. G01N 27/72; G01N 24/00; G01R 33/135; G01C 21/08

[52] U.S. Cl. ................................ 324/228; 324/262; 505/726

[58] Field of Search ............... 324/228, 262, 248; 505/726, 727, 842, 843; 361/17

[56] References Cited

PUBLICATIONS

Melnikov et al, "A Method for determining the super-conducting temperture", Apr. 1976, Cryogenics vol. 16, No. 4 p. 246.

*Primary Examiner*—Walter E. Snow
*Attorney, Agent, or Firm*—James R. McDaniel; James C. Davis, Jr.; Paul R. Webb, II

[57] ABSTRACT

An apparatus and method is disclosed for evaluating the superconducting quality of superconducting materials. The materials are wound on a bifilar spool and tested in a cryogenic atmosphere to determine when the material quenches. During the testing procedure, the electromagnetic field, current and temperature imposed on the material are varied and the test results are compared with known results to determine if the material is superconductive. In this way, large samples can be tested in a non-destructive manner.

6 Claims, 8 Drawing Sheets

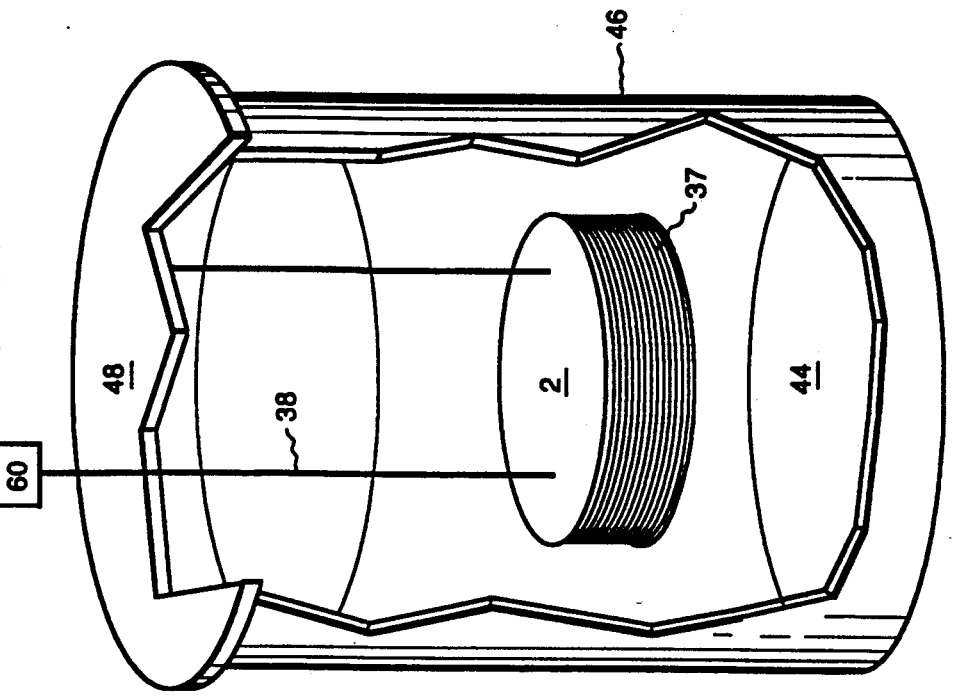
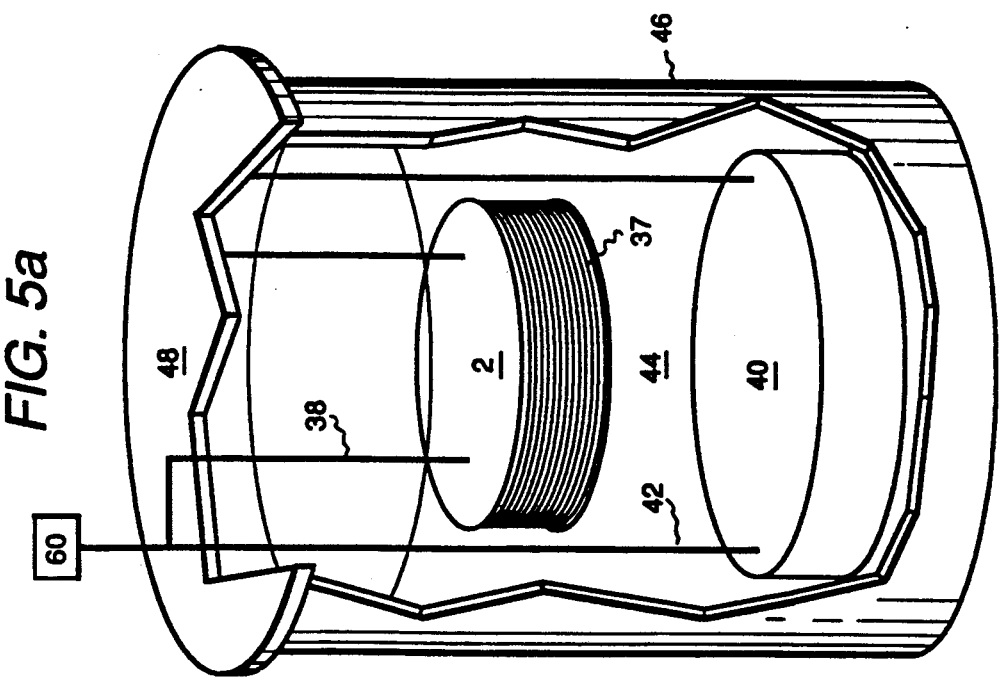

APPARATUS AND METHOD FOR THE NON-DESTRUCTIVE EVALUATION OF A BIFILAR SUPERCONDUCTING WINDING

BACKGROUND OF THE INVENTION

1. Field of the Invention

This invention relates to a non-destructive apparatus and method for evaluating the properties of superconducting materials. Such structures of this type generally allow the superconducting material to be tested without having to destroy the material or throw the material away.

2. Description of the Related Art

It is known in prior superconducting material evaluation systems to use either destructive or non-destructive systems. In particular, a destructive system has been developed for both short sample tests and long sample tests. In the short sample tests, sections of superconducting material (here referred to as tape), usually, between 4 inches to 4 feet long are removed from the entire length of prepared superconducting tape and tested by conventional testing procedures using a background electromagnetic field with the tape being immersed in liquid helium. It is to be understood that while superconducting tape is discussed, superconducting wire could also be used. The current that is run through the short sample is varied to see at what value the short sample quenches, and the current is compared with the results of a graph much like the one in FIG. 1 where current in amps is plotted against electromagnetic field strength (B). If the field strength is known and the temperature value is known, then the operator can extrapolate from the graph as to whether the short sample quenched is in agreement with the current at which a good tape should quench, given the same field strength and temperature values. If the short sample test falls within the guidelines as set forth in FIG. 1 for a particular current, electro-magnetic field, and temperature, then it is assumed that the entire tape is good. If the short sample does not fall within the guidelines, then it is assumed that the entire tape is defective. While the short sample method is a general way to determine if the entire tape is good or defective, the method is destructive because the sample must first be cut down and then thrown away after the testing. Also, the short sample only tests a little part of the entire tape, and maybe the rest of the tape is not defective even if the sample proves to be defective. Therefore, a more advantageous system, then, would be presented if the test could be performed in a non-destructive manner while testing a substantially longer portion of the tape or the entire tape.

In order to test a substantially longer portion of tape, usually, between 1000 to 7000 feet, a long sample, destructive evaluation system was developed. In this case, a long sample of superconducting material, typically, one inch wide is cut into 7 strips with each strip being approximately 3 mm in width. The outer two strips along each edge of the material are then epoxy impregnated according to a conventional practice. The outer two strips were selected because it was determined by conventional statistical analysis that the edges of the material are the places where defects in the material are most likely to be located. Also, the long sample has to be impregnated so that the sample could withstand the electromagnetic forces experienced by it when the current was run through the long sample. In other words, the impregnation provided the needed support for the sample so that the sample would not mechanically fail due to the current passing through it. These impregnated coils were then tested by using the same test procedure used to test the short samples except that a background electromagnetic field is not necessary. If the long samples fell within the guidelines as shown in FIG. 1, it was assumed that the entire tape was good. If the long sample was bad, it was assumed that the entire tape was bad. This long sample test provided a more accurate test as to the quality of the entire tape but the long sample still had to be destroyed because it was impregnated. Consequently, a still more advantageous system, then, would be presented if the advantageous longer samples were used but without having to destroy the samples.

Non-destructive tests for evaluating the quality of superconducting materials have been developed but, only for use in a non-cryogenic atmosphere, however. Beyond the obvious test of visually inspecting the tape, a conventional eddy current test or an ultrasound test was performed on the sample. While these tests pointed out obvious flaws in the tape, they did not test the actual superconducting characteristics of the tape because the superconducting characteristics should be determined at cryogenic temperatures. Consequently, a further more advantageous system, then, would be presented if the advantageous longer samples were used but were tested in an atmosphere in which a more accurate determination as to the quality of the sample could be attained.

It is apparent from the above that there exists a need in the art for an evaluation system for superconducting materials which determines the superconducting quality of the material, and which at least is capable of evaluating samples of a relatively long length, but which at the same time performs the evaluation in a non-destructive manner in an atmosphere that produces the most accurate information. It is a purpose of this invention to fulfill this and other needs in the art in a manner more apparent to the skilled artisan once given the following disclosure.

SUMMARY OF THE INVENTION

Generally speaking, this invention fulfills these needs by providing an apparatus for evaluating the superconducting quality of a superconducting material, comprising a spool means having a bifilar winding substantially wrapped around said spool means, a cooling means for cooling said spool means to approximately cryogenic temperatures, a holding means for holding said spool means and said cooling means, and an evaluation means for testing said winding to determine if said winding has a predetermined superconducting value.

In certain preferred embodiments, the spool means includes an S-cut which allows the winding to be wound on the spool without having to cut the winding and which also allows the winding to be easily unwound onto another spool without adversely affecting the mechanical properties of the winding. Secondly, the bifilar winding is used so that the currents which flow in opposite directions between adjacent tapes in a bifilar winding, cancel each other out which results in no net inductance in the bifilar winding which, in turn, eliminates the adverse electro-magnetic forces usually found in superconducting coils. Thirdly, the cooling means is liquid helium. Finally the evaluation means imposes a known magnetic field in the winding and by either varying the current or the temperature one can determine if the entire winding is defective or not by comparing the results attained from the test with the predetermined results plotted on a well-known graph for a good superconducting tape.

In another further preferred embodiment, substantially the entire winding can be non-destructively evaluated in an atmosphere which will provide an accurate determination as to the superconducting qualities of the winding.

The preferred superconducting materials evaluation system, according to this invention, offers the following advantages: easy assembly; good stability; good durability; lack of destruction of the sample; increased size of the sample measured; good economy; improved testing conditions; and high strength for safety. In fact, in many of the preferred embodiments, these factors of lack of destruction of the sample, increased sample size and improved testing conditions are optimized to an extent considerably higher than heretofore achieved in prior, known superconducting material evaluation systems.

BRIEF DESCRIPTION OF THE DRAWINGS

The above and other features of the present invention which will become more apparent as the description proceeds are best understood by considering the following detailed description in conjunction with the accompanying drawings wherein like characters represent like parts throughout the several views and in which:

FIG. 5a is a schematic representation of the testing apparatus for evaluating the superconducting qualities of the bifilar winding while using an electro-magnetic field, according to the present invention;

FIG. 5b is a schematic representation of the testing apparatus which is similar to FIG. 5a but without using an electro-magnetic field, according to the present invention;

DETAILED DESCRIPTION OF THE INVENTION

Figure 2:
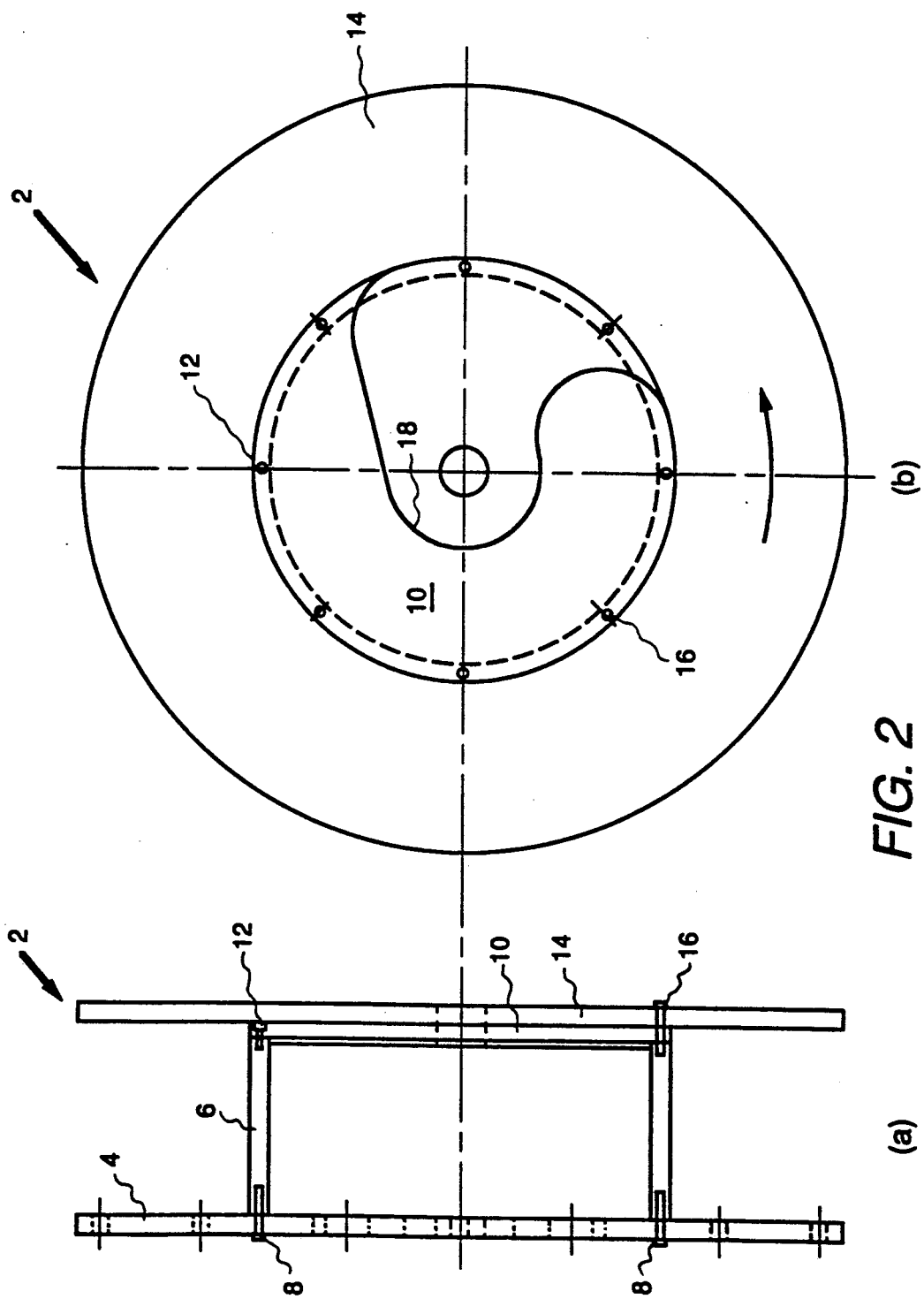
FIG. 2a is a side view of the S-cut bifilar spool, according to the present invention.
FIG. 2b is a front view of the S-cut bifilar spool, according to the present invention.

With reference to FIGS. 2a and 2b, there is illustrated a bifilar spool 2. Spool 2 includes flanges 4 and 14, bobbin 6, conventional fasteners 8, 12, and 16, and S-cut plate 10. Flanges 4 and 14, bobbin 6 and plate 10, preferably, are constructed of any suitable fiberglass filled epoxy material or copper. Flange 4 is rigidly attached to one end of bobbin 6 by fasteners 8. S-cut plate 10 is rigidly attached to the other end of bobbin 6 by fasteners 12. Flange 14 is rigidly attached to bobbin 6 and plate 10 by fasteners 16.

With respect to S-cut plate 10, plate 10 includes groove 18. Groove 18, preferably, is milled in plate 10 by conventional machining techniques to a depth of approximately 4 mm. Groove 18 is provided to allow the continuous superconducting tape 24 (FIG. 3a) to be captured by flange 14 and which also provides the minimum radius to avoid damaging the tape and allows the tape to be bifilarly wound.

Figure 3C:
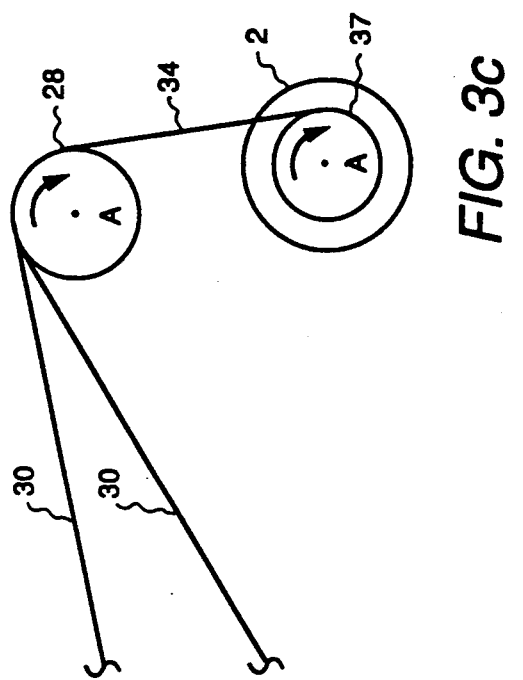
FIGS. 3a-3c are various embodiments for winding superconducting tape from spools or insulator on the bifilar spool.
Figure 3A:
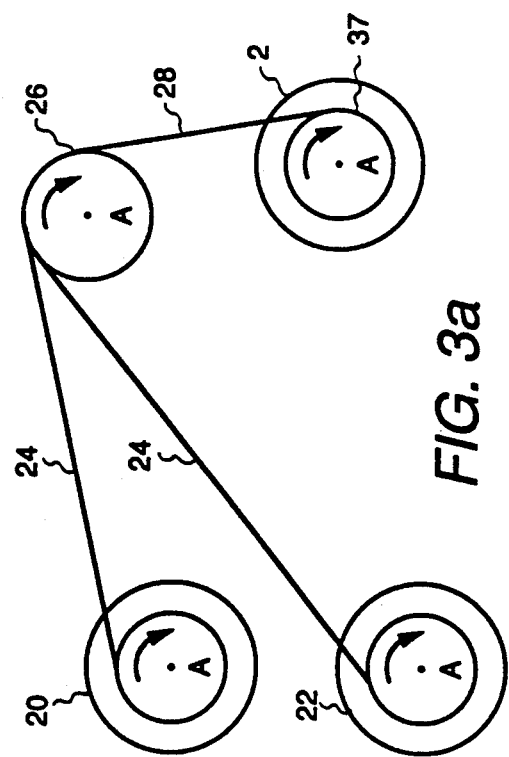
Figure 3B:
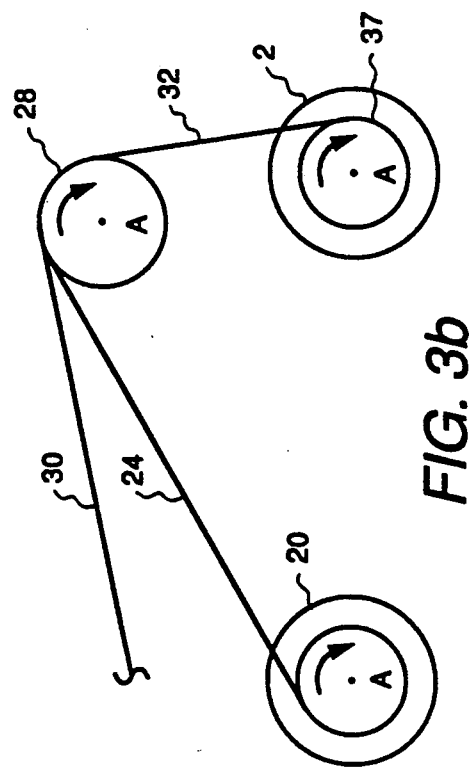

FIGS. 3a-3d shows how spool 2 is bifilarly wound with superconducting tape 24 coming from a supply spool or superconducting tape 30 coming from an insulator. In particular, with respect to FIG. 3a, supply spools 20,22 which, typically, are wound with a niobium-tin, hereinafter referred to as Nb-Sn, tape conductor 24. The ends of conductor 24 from spools 20,22 are, initially, welded together with either a conventional pig tail weld or an in-line weld and fed as a bifilar tape 28 over pulley 26. In the case of pig tail weld, the bifilar tape 28 is attached to bobbin 6 (FIG. 2a) and in the case of in-line weld tape 28 is attached by conventional fastening techniques to groove 18 (FIGS. 2b) in bifilar spool 2. Spool 2 is rotated clockwise by a conventional rotating mechanism (not shown) along arrow A. The rotation of spool 2 causes supply spools 20,22 to also rotate along the same direction A which, in turn, causes tape 24 to come off of spools 20,22, form bifilar tape 28, and become wound on spool 2 to form winding 37. After a sufficient amount of tape, preferably, 1000 to 30,000 feet, have been wound on spool 2, the winding process is stopped. FIG. 3b shows how tapes 24 from a supply spool and 30 from a conventional insulator form a bifilar tape 32 which is wound on spool 2 to form winding 37 according to the same technique as used in FIG. 3a. FIG. 3c depicts the winding of bifilar tape 34 on spool 2 to form winding 37. Tape 34 is, preferably, constructed of two layers of tape 30 coming from insulator. It is to be understood that the winding techniques as shown in FIGS. 3a-3c require the use of a pig tail weld or in-line weld.

Figure 4A:
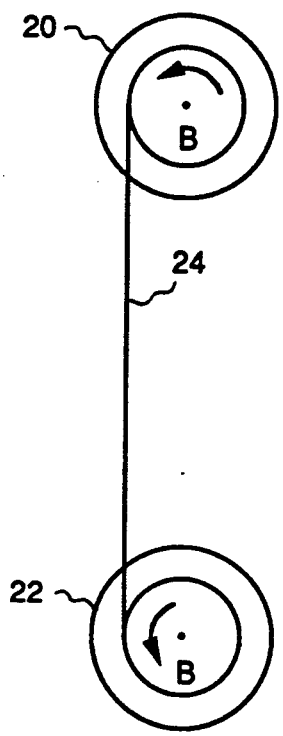
FIGS. 4a and 4b are another embodiment for winding tape from spools or insulator on the bifilar spool.
Figure 4B:
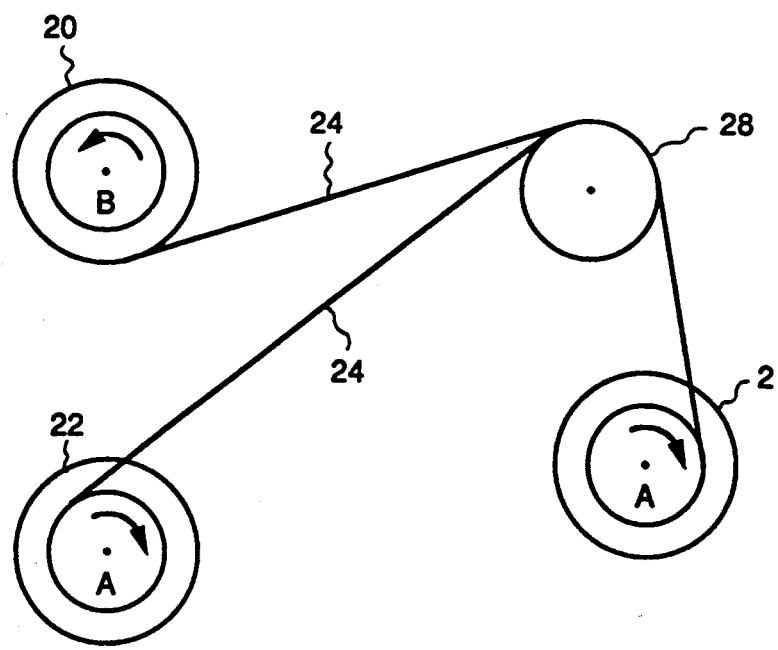

FIGS. 4a and 4b illustrate another embodiment for winding tape 24 from spools or insulator 30 on spool 2. However, only tape 24 will be discussed in this embodiment. In particular, a pig tail weld or in-line weld is not needed because in order to wind tape 24 on spool 2, approximately one-half of tape 24 from supply spool 20 is wound onto supply spool 22 in a counterclockwise direction along arrow B (FIG. 4a). Next, a portion of tape 24 which spans between supply spools 20,22 is run over pulley 26 and placed in groove 18 (FIG. 2b) in spool 2 (FIG. 4b). Spool 2 is rotated in a clockwise direction along arrow A which now causes spool 20 to continue rotating along direction B and spool 22 to rotate along arrow A (FIG. 4b). Again, once sufficient amount of tape 24 is wound on spool 2, the winding process is stopped. It is to be understood that FIGS. 4a and 4b represent the preferred method of winding bifilar tapes on spool 2 because no pig tail or in-line welds are used in the winding. It is well-known that welds or joints in the winding can adversely affect the superconducting properties of the winding so, if welds can be eliminated, it would be advantageous.

FIGS. 5a and 5b illustrate two methods for testing the superconducting quality of bifilar winding 37. With respect to FIG. 5a, a bifilar spool 2 which contains a superconducting winding 37 is placed in a container 46. Container 46 also holds a conventional electro-magnetic field generating superconductive coil 40, liquid helium 44, and a lid 48. Spool 2 and coil 40 are electrically connected to a conventional control mechanism 60 by wires 38, 42, respectively. In this test, coil 40 is activated and a predetermined electromagnetic field or B field, typically, having a value of 0–7 Tesla, is placed on coil 40. Once the field strength is known, the temperature of the spool 2 can be varied and the current through winding 37 can be kept constant, typically, at between 400 to 500 amps, until winding 37 quenches. Immediately after coil 37 quenches and as already discussed above, the temperature at which coil 37 quenches is compared with the values given in FIG. 1 for a given field strength and current value to determine if winding 37 is good. It is to be understood that the temperature could be kept constant and the current varied until coil 37 quenched in order to achieve the same quantitative analysis as to the superconducting quality of winding 37.

FIG. 5b shows another testing method for evaluating the superconducting quality of a superconducting tape. In this case, only a bifilar spool 2 having a superconductor winding 37 is placed in container 46 along with liquid helium 44. As with the testing procedure carried out with FIG. 5a, either the current or temperature is varied until winding 37 quenches and the results are compared with FIG. 1. It is to be understood that in the particular testing apparatus set forth in FIG. 5b, that electromagnetic field value equals 0 because no field is present in container 46.

The testing apparatus embodied in FIGS. 5a and 5b are an improvement over the prior testing procedures because winding 37 operates most efficiently at cryogenic temperatures so it is apparent that the winding should be tested at cryogenic temperatures to determine if the winding is good.

The preferred method of testing is to use the apparatus set forth in FIG. 5b. This is because when coil 40 creates an electromagnetic field in winding 37, the field across the entire winding 37 is not uniform. Thus, when winding 37 quenches the quenching current and temperatures are fairly accurately determined but, it is difficult to determine at which point on winding 37 the winding was, for example, at a field value of 4 T, when the quenching occurred. Assuming that 4 T was the field value on coil 40. Consequently, in order to avoid the possible problems associated with the apparatus in FIG. 5a, FIG. 5b is preferred because B always equals zero which eliminates one parameter. It is to be understood though that the testing system embodied in FIG. 5a may be used if, for example, it is difficult to stabilize the temperature within container 46 or if there are any characteristics of winding 37 or the joints in winding 37 which would be specific to the field created by coil 40.

Figure 6:
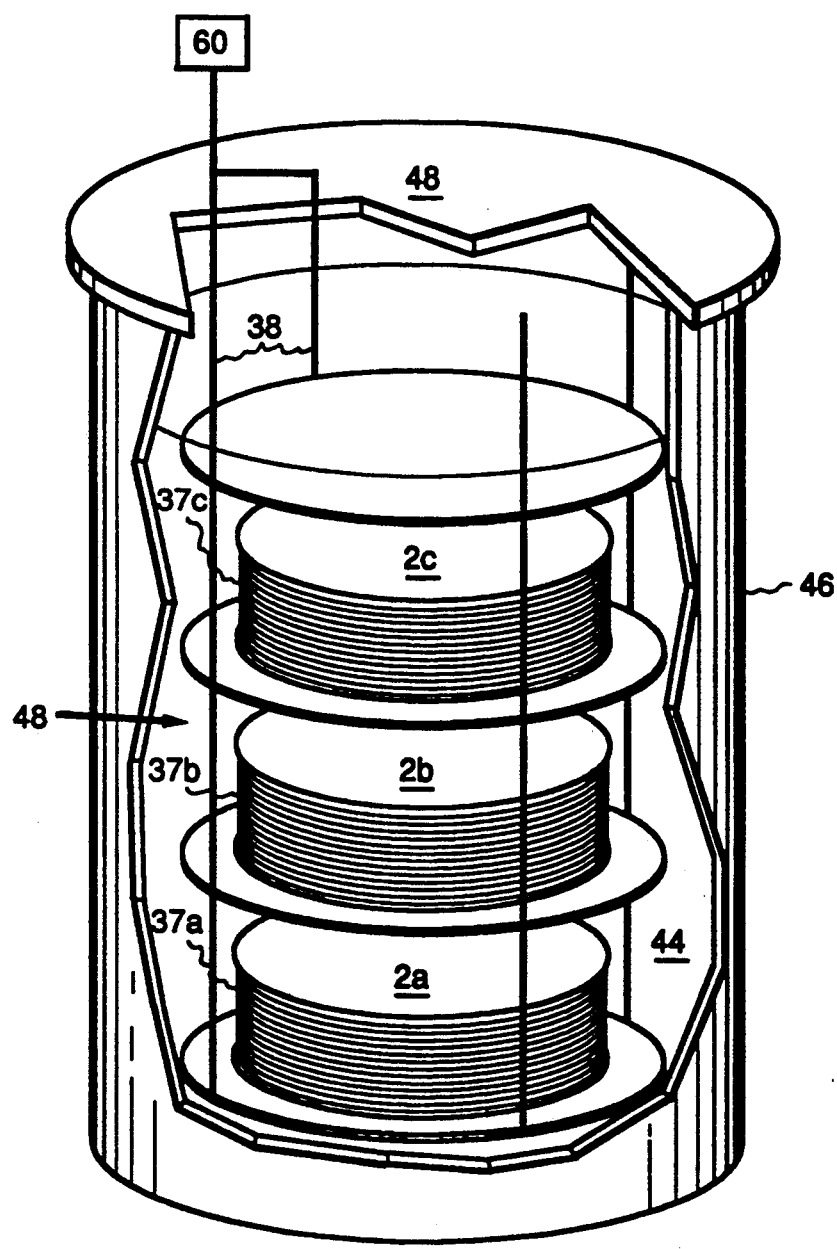
FIG. 6 is another schematic representation of the testing apparatus which is similar to FIG. 5b but where multiple bifilar windings are capable of being tested, according to the present invention.

FIG. 6 illustrates yet another system for testing the quality of the tapes. This system is similar to the apparatus embodied in FIG. 5b, in that, no field is being used in container 46. However, in this particular testing embodiment, several windings 37a, 37b, 37c are placed in container 46. Container 46 also includes liquid helium 44. Spools 2a, 2b, 2c are retained in container 46 by a conventional holder 48. Holder 48 should be constructed as to allow helium 44 or its vapor to contact windings 37a, 37b, 37c but also strong enough to support spools 2a, 2b, 2c. Also, holder 48 should allow the operator to be able to test the quality of winding 37a without adversely affecting the superconducting characteristics of windings 37b and 37c. The testing procedure for testing windings 37a, 37b, 37c is the same as discussed with reference to FIG. 5b however, it is preferred that winding 37a be tested first then followed by winding 37b and, finally, winding 37c. After the quality of windings 37a, 37b and 37c is determined, spools 2a, 2b, 2c are removed.

Figure 7:
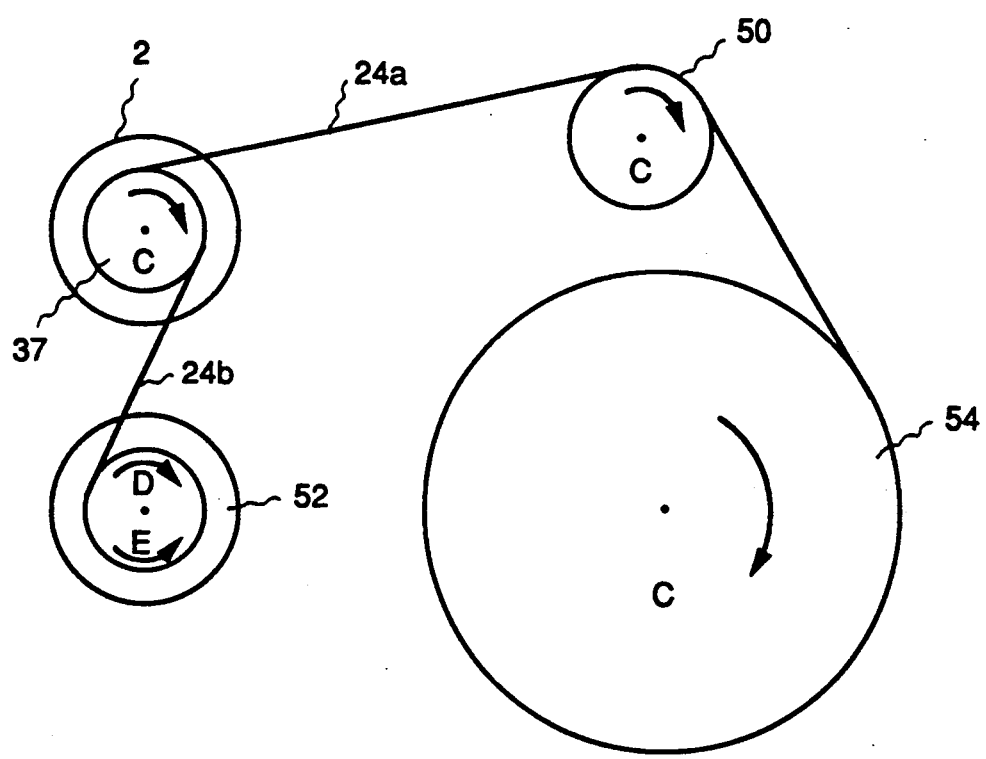
FIG. 7 is a schematic representation of the bifilar winding being unwound, according to the present invention.

FIG. 7 illustrates how winding 37 is unrolled from bifilar spool 2 after winding 37 has been tested and winding 37 was found to be good. In particular, tapes 24a and 24b are separated from bifilar winding 37. Tape 24a is then run over a conventional pulley 50 and wound on a conventional magnet cartridge 54. Tape 24b is placed on transition spool 52 and wound on spool 52 so that spool 52 rotates along arrow E. As spool 52 is rotated by a conventional rotating device (not shown) in a counterclockwise direction along arrow E and cartridge 54 is rotated by a conventional rotating device (not shown) in a clockwise direction along arrow C, winding 37 becomes unwound from spool 2. Once all the tape 24a, 24b is unwound from spool 2, cartridge 54 continues to rotate such that tape 24b is now being unwound directly from transition spool 52 so that spool 52 now rotates along arrow E. Tape 24b is capable of being directly unwound by cartridge 54 due to the groove 18 (FIG. 2b) in spool 2.

Figure 1:
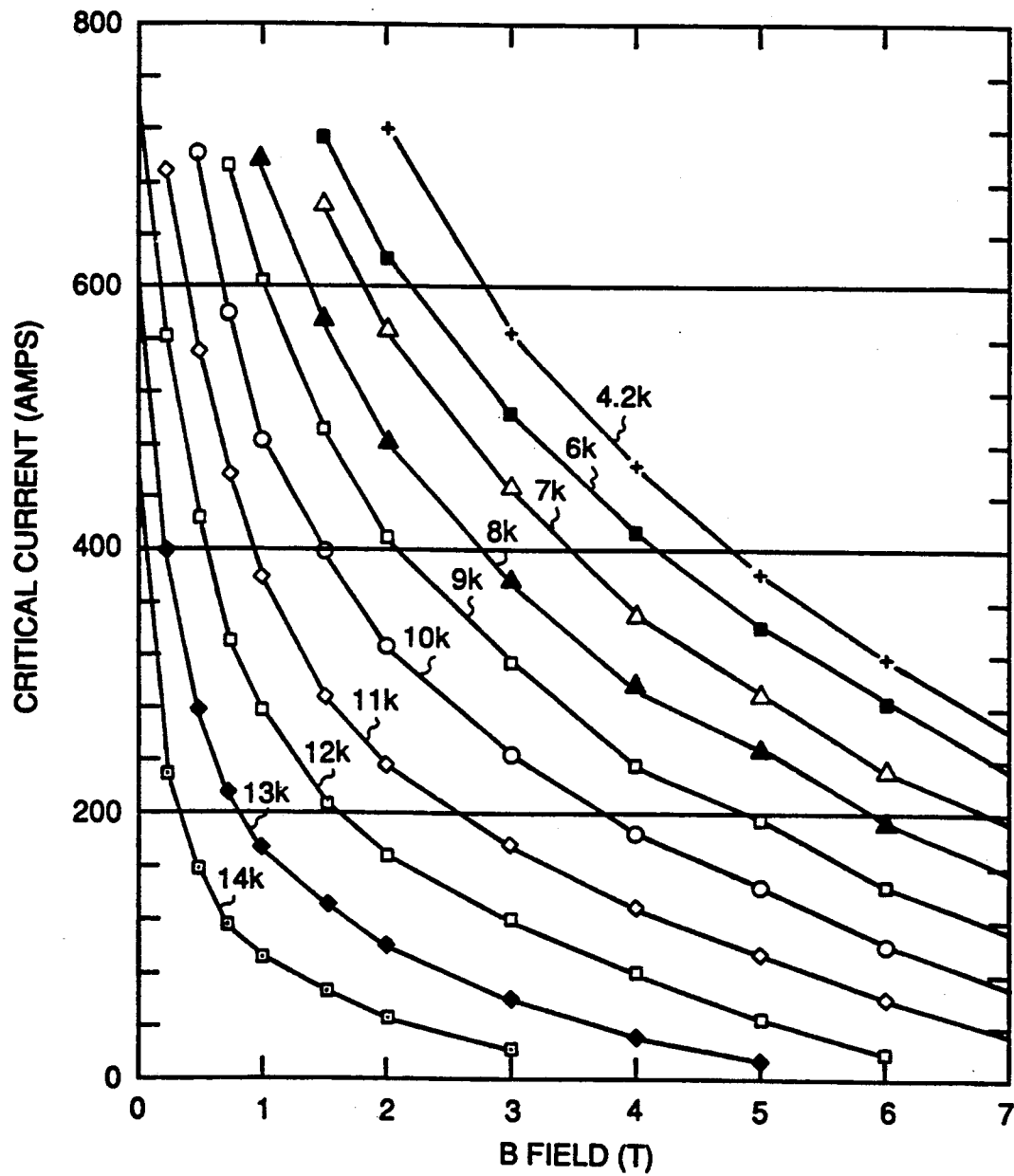
FIG. 1 is a graphical representation of the performance characteristics for a 48 A/mm superconducting tape for various critical currents, electro-magnetic field strengths and temperatures.
Figure 8:
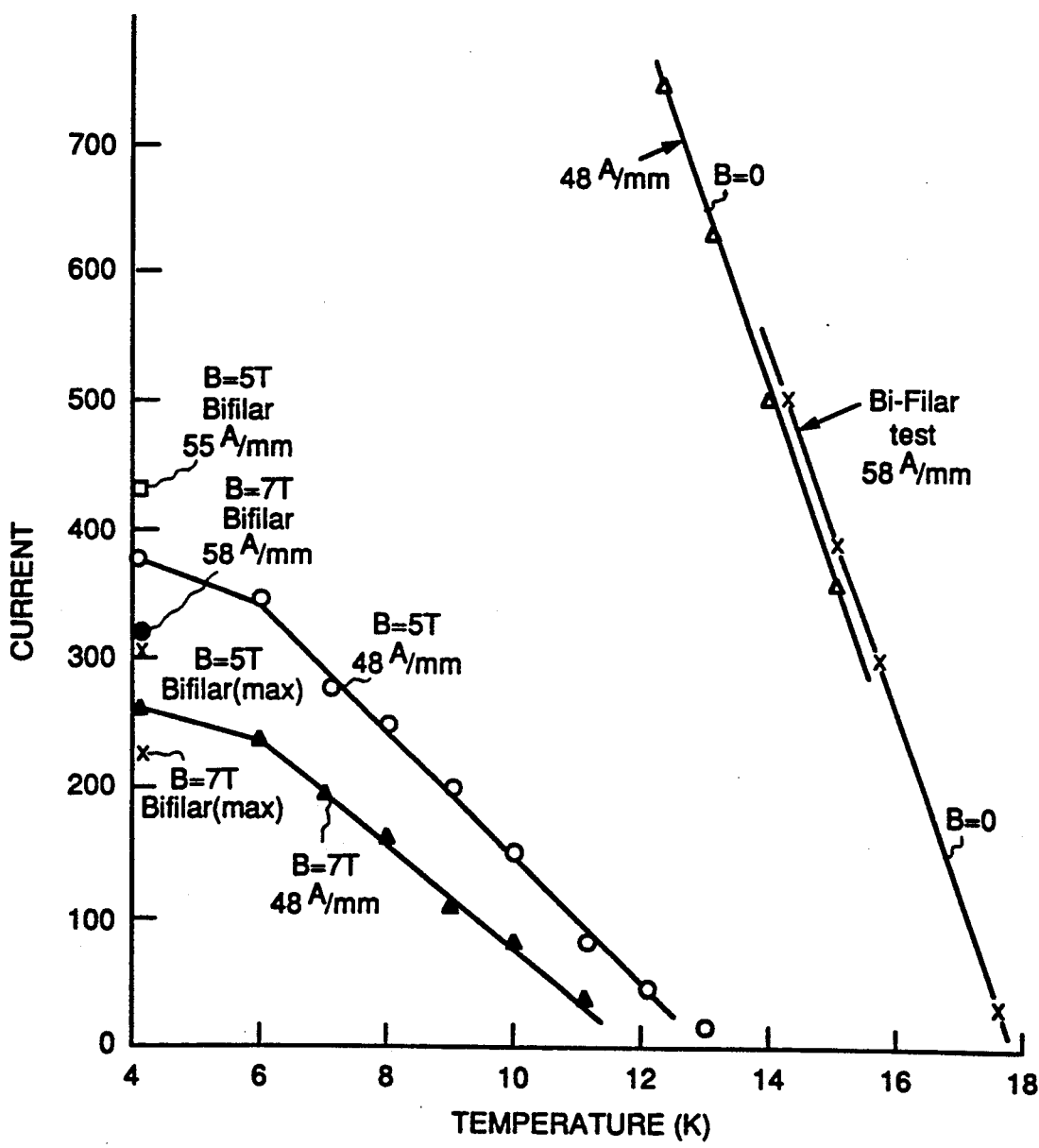
FIG. 8 is a graphical representation of the results attained from FIG. 1 plotted against the results attained from using a superconducting tape having a rating of 58 A/mm.

FIG. 8 is a graphical representation of the results from FIG. 1 for a 48 A/mm conducting tape using temperature in degrees K as the abscissa and current in amps as the ordinate. As can be seen when B=O for a 48 A/mm tape, the values plotted follow a relatively straight line. This is important because when another tape, for example, a 58 A/mm is used, the plotted values should also follow a straight line when B=O. Also, FIG. 8 shows that for the same conditions, namely, the same B, T and current values, the 58 A/mm tape is a better conducting tape because it quenches at a higher temperature and a higher current than a 48 A/mm tape.

Once given the above disclosure, many other features, modifications or improvements will become apparent to the skilled artisan. Such features, modifications or improvements are, therefore, considered to be a part of this invention, the scope of which is to be determined by the following claims.

What is claimed is:

1. An apparatus for evaluating the superconducting quality of a superconducting material said apparatus is comprised of:
    a spool means having a bifilar superconducting winding substantially wrapped around said spool means;
    a cooling means for cooling said spool means to approximately cryogenic temperatures;
    a holding means for holding said spool means and said cooling means;
    an electromagnetic field producing means;
    a temperature sensing means;
    an electric current measuring means; and
    a quench determination means for determining when said winding quenches.

2. The evaluation apparatus, according to claim 1, wherein said spool means is further comprised of:
    an S-cut groove means in which a portion of said winding is located.

3. The evaluation apparatus, according to claim 1, wherein said cooling means is further comprised of:
 liquid helium.

4. The evaluation apparatus, according to claim 1, wherein said holding means is further comprised of:
 a container; and
 a first holder located within said container.

5. A method for evaluating the superconducting quality of a superconducting material having a spool means including a bifilar winding, a cooling means, a holding means including a lid means and an evaluation means, said method comprised of the steps of:
 placing said cooling means in said container means;
 placing said spool means in said container means;
 placing said lid means on said container means;
 regulating a temperature of said winding; and
 observing and recording a current in said winding until said winding substantially quenches.

6. A method for evaluating the superconducting quality of a superconducting material having a spool means including a bifilar winding, a coil means located adjacent to said winding, a cooling means, a holding means including a lid means and an evaluation means, said method comprised of the steps of:
 placing said cooling means in said container means;
 placing said spool means and said coil means in said container means;
 placing said lid means on said container means;
 placing a predetermined electro-magnetic field in said coil means;
 regulating a temperature of said winding; and
 observing and recording a current in said winding until said winding substantially quenches.

* * * * *